United States Patent
Rum

(10) Patent No.: US 10,839,613 B2
(45) Date of Patent: Nov. 17, 2020

(54) FAST MANIPULATION OF OBJECTS IN A THREE-DIMENSIONAL SCENE

(71) Applicant: Dassault Systemes, Velizy Villacoublay (FR)

(72) Inventor: Thomas Rum, Issy-les-Moulineaux (FR)

(73) Assignee: DASSAULT SYSTEMES, Velizy Villacoublay (FR)

(*) Notice: Subject to any disclaimer, the term of this patent is extended or adjusted under 35 U.S.C. 154(b) by 0 days.

(21) Appl. No.: 15/843,967

(22) Filed: Dec. 15, 2017

(65) Prior Publication Data
US 2018/0182177 A1    Jun. 28, 2018

(30) Foreign Application Priority Data
Dec. 22, 2016  (EP) .................................. 16306773

(51) Int. Cl.
  *G06T 15/00*   (2011.01)
  *G06T 19/20*   (2011.01)
  (Continued)

(52) U.S. Cl.
  CPC ............ *G06T 19/20* (2013.01); *G06F 3/0486* (2013.01); *G06F 3/04812* (2013.01);
  (Continued)

(58) Field of Classification Search
  CPC ............. G06F 3/04815; G06F 3/04845; G06F 3/0486; G06F 3/04812; G06F 17/50;
  (Continued)

(56) References Cited

U.S. PATENT DOCUMENTS 7,893,935 B1 *  2/2011  Neely, III ............... G06F 3/011
                                                    345/419
8,493,389 B2 *  7/2013  Olivan Bescos ... G06F 3/04815
                                                    345/419
(Continued)

OTHER PUBLICATIONS

Geek on Java, Drag and Drop 3D Object Using Three.js Javascript library; Oct. 2016; https://www.youtube.com/watch?v=WYH2jWcXsug.*

(Continued)

*Primary Examiner* — Phu K Nguyen
(74) *Attorney, Agent, or Firm* — Hamilton, Brook, Smith & Reynolds, P.C.

(57) ABSTRACT

A computer-implemented method for manipulating at least one three-dimensionally modeled object (O1) in a three-dimensional scene displayed on a computer display. The method displays, in the three-dimensional scene, a cursor (C) controlled by a pointing device (PD). The cursor has a shape representing three axes (X, Y, Z) of a coordinate system. Next the method selects an object of the three-dimensional scene; and detects a drag operation performed by a user using the pointing device. The drag operation translates the cursor and selects an axis of the coordinate system as a function of the translation of the cursor. Also the method performs a manipulation of the selected object. The manipulation depends on the selected axis and on a length (L) of the translation of the cursor (PP) along the selected axis.

12 Claims, 6 Drawing Sheets

(51) Int. Cl.
G06F 3/0481 (2013.01)
G06F 3/0486 (2013.01)
G06F 3/0484 (2013.01)
G06F 30/00 (2020.01)
G06T 19/00 (2011.01)

(52) U.S. Cl.
CPC ...... *G06F 3/04815* (2013.01); *G06F 3/04845* (2013.01); *G06F 30/00* (2020.01); *G06T 19/003* (2013.01); *G06T 2219/2004* (2013.01)

(58) Field of Classification Search
CPC ............. G06T 19/20; G06T 2219/2016; G06T 19/003; G06T 2219/2004
USPC ......................................................... 345/419
See application file for complete search history.

(56) References Cited

U.S. PATENT DOCUMENTS

| | | | | |
|---|---|---|---|---|
| 8,539,386 | B2* | 9/2013 | Capela | G06F 3/0488 345/173 |
| 8,854,357 | B2* | 10/2014 | Chauvin | G06F 3/04815 345/419 |
| 9,937,022 | B2* | 4/2018 | Kriveshko | G06T 17/00 |

OTHER PUBLICATIONS

Schaefer S, McPhail T, Warren J. Image deformation using moving least squares. InACM transactions on graphics (TOG) Jul. 30, 2006 (vol. 25, No. 3, pp. 533-540). ACM.*

Igarashi T, Moscovich T, Hughes JF. As-rigid-as-possible shape manipulation. InACM transactions on Graphics (TOG) Jul. 31, 2005 (vol. 24, No. 3, pp. 1134-1141). ACM.*

Sorkine O, Alexa M. As-rigid-as-possible surface modeling. InSymposium on Geometry processing Jul. 4, 2007 (vol. 4, pp. 109-116).*

Xu et al, As Rigid as Possible Mesh Deformation, Published on Nov. 29, 2011, https://www.youtube.com/watch?v=nHjmkas3bzA.*

Gissler M, Becker M, Teschner M. Constraint Sets for Topology-changing Finite Element Models. InVRIPHYS Nov. 9, 2007 (pp. 21-26).*

QuickVFX, Cinema4D Tutorial: Attaching Vertices to Objects (Beginner), Published on Jun. 13, 2013; https://www.youtube.com/watch?v=J MBx99shviM.*

Allen, Cinema 4D Tutorial : Editing / Modelling HyperNURBS, 2010, https://www.youtube.com/watch?v=VNWhs9TXvMQ.*

European Search Report for Int'l Application No. 16306773.9, entitled "Fast Manipulation of Objects in a Three-Dimensional Scene," consisting of 8 pages, dated Jun. 6, 2017.

Anonymous: "Draft Move-FreeCAD Documentation", Apr. 29, 2016 (Apr. 29, 2016), XP055375554, Retrieved from the Internet: URL:https://web-beta.archive.org/web/20160429201817/http:/1 www.freecadweb.org/wiki/index.php?title=Draft_Move [retrieved on May 23, 2017].

Nielson, et al., Interactive 3D Graphics "Direct Manipulation Techniques for 3D Objects Using 2D Locator Devices", Oct. 24, 1986 (Oct. 24, 1989), XP055375566, Retrieved from the Internet: URL:http://dl.acm.org/ft_gateway.cfm?id=319134&ftid=13157&dwn=1 &CFID=766097440&CFTOKEN=96911540 [retrieved on May 23, 2017].

Bier, Eric A., "Snap-Dragging in Three Dimensions", Interactive 3D Graphics, ACM, 2 Penn Plaza, Suite 701 New York, NY 10121-0701 USA, Feb. 1, 1990 (Feb. 1, 1990 ), pp. 193-204, XP058220246, DOI: 10.1145/91385.91446; ISBN: 978-0-89791-351-5.

* cited by examiner

FAST MANIPULATION OF OBJECTS IN A THREE-DIMENSIONAL SCENE

RELATED APPLICATION(S)

This application claims priority under 35 U.S.C. § 119 or 365 to Europe, Application No. 16306773.9, filed Dec. 22, 2016. The entire teachings of the above application(s) are incorporated herein by reference.

FIELD OF INVENTION

The invention relates to a computer-implemented method for manipulating objects in a three-dimensional scene displayed on a computer display. It pertains to the fields of computer graphics, Authoring, Computer Aided Design (CAD), Computer Aided Engineering (CAE) and Computer Aided Manufacturing (CAM), and applies to all the situations wherein a digitally-modeled object has to be manipulated (translated, rotated, resized . . . ) within a three-dimensional scene.

BACKGROUND

Three-dimensional modeling requires the ability to manipulate elements (objects) of a three-dimensional scene, e.g. by selecting, scaling, translating, rotating, etc. them within the scene.

In the early days of three-dimensional modeling, all these transformations were parametric, i.e. defined by numerical inputs entered by a user by means e.g. of a keyboard. This approach is slow, cumbersome and clearly not intuitive.

Quite soon, researchers started to devise non-parametric user interfaces (UIs) for manipulating objects using pointing devices such as mice, joysticks, touchpads, etc. However, such pointing devices are intrinsically two-dimensional: for instance, a mouse cursor can be moved in two-dimensions only, and therefore cannot be directly used to define a three-dimensional manipulation. To overcome this limitation, the early non-parametric methods for manipulating objects involved several steps—typically the selection of one or several points of the object, and then the choice of an action to be applied to said points. This approach—which can be called "non-immersive"—remains unsatisfactory, as selecting points and choosing actions are slow and cumbersome operations. Examples of early non-immersive user interfaces for manipulating objects in three-dimensions are described by:

Eric A. Bier "Skitters and jacks: interactive 3D positioning tools", in Proceedings of the 1986 Workshop on Interactive 3D Graphics, pages 183-196. ACM: New York, October 1986; and Eric A. Bier "Snap-dragging: Interactive geometric design in two and three dimensions" Report. University of California, Berkeley. Computer Science Division 1988.

To streamline and make more intuitive the manipulation of three-dimensional objects in three dimensions, "immersive" Graphical User Interfaces (GUIs) were subsequently introduced. They rely on graphical tools—called e.g. "interactors" or "manipulation tools"—which are introduced in the three-dimensional scene and allow a more direct manipulation of selected object.

An early example of immersive manipulation GUI is described in:

Stephanie Houde, "Iterative design of an interface for easy 3-D direct manipulation", Proceedings of the SIGCHI Conference on Human Factors in Computing Systems, p. 135-142, May 3-7, 1992, Monterey, Calif., USA.

This GUI is based on a bounding box with handles which is defined around the selected object. Acting on the handles allows manipulating the object.

Another known interactor is the so-called "robot" used by Dassault Systemes and described in EP0824247. The "robot" is constituted of different elements, each associated to a different transformation. More particularly, it comprises three axes, each representing a translation, three arcs, each representing a rotation, and three planar figures, representing 2D translations in respective planes. The "robot" is attached to an object to be manipulated, and then transformations of the objects are triggered by clicking on the respective elements of the interactor.

Yet another example of immersive GUI is provided by EP0824247, which discloses an interactor having the shape of three perpendicular and intersecting segments, each defining a Cartesian axis, with spheres at their ends; an additional sphere is situated at the center of the interactor. The user interacts with the spheres by dragging them with a cursor controlled e.g. by a mouse. Dragging the central sphere allows translating the object to which the interactor is attached. Dragging any other sphere in the direction of the corresponding segment defines a scaling in the direction of the segment. And dragging a sphere, other than the central one, in a direction perpendicular to that of the corresponding segment defines a rotation.

Immersive UIs are much more intuitive than non-immersive ones. Nevertheless, they also have significant drawbacks:

The interactor often causes a visual occlusion of the object to be manipulated;

The use of the interactor may be complex;

The user needs selecting specific parts of the interactor, which is time consuming and may be difficult if the interactor is small (which may be required to minimize visual occlusion).

A completely different approach consists in using 3D input devices, e.g. a 3D mouse, to directly define 3D transformations. This approach, however, is not very flexible as it relies on specific hardware, which tends to be expensive and is not widespread. A multi-button mouse may constitute a simple 3D input device, but its use is not very intuitive and requires training.

SUMMARY

The invention aims at overcoming the drawbacks of the prior art. More particularly, it aims at providing a Graphical User Interface for 3D manipulations of objects causing minimal obstruction and providing a high speed of interaction, while being simple and intuitive to use.

An object of the present invention allowing achieving these aims is a computer-implemented method for manipulating at least one three-dimensionally modeled object in a three-dimensional scene displayed on a computer display, the method comprising the steps of:

a) displaying, in the three-dimensional scene, a cursor controlled by a pointing device, the cursor having a shape representing three axes of a coordinate system;

b) selecting an object of the three-dimensional scene;

c) detecting a drag operation performed by a user using said pointing device, said drag operation comprising a translation of the cursor, and selecting an axis of the coordinate system as a function of said translation of the cursor; and d) performing a manipulation of the selected object, said manipulation depending on the selected axis and by a length of the translation of the cursor along the selected axis.

According to particular embodiments of the invention:

Step c) may comprise selecting the axis of the coordinate system having a direction which is closest to that an initial segment of said translation of the cursor.

After said initial segment, the translation of the cursor is preferably only performed along the selected axis.

Step b) may comprise automatically selecting the object of the three-dimensional scene which is closest to the cursor. Alternatively, step b) may comprise selecting an object of the three-dimensional scene according to a command from the user.

The manipulation performed in step d) may be chosen among the group comprising: a translation of the selected object along the selected axis by a distance proportional to the length of the translation of the cursor along the selected axis; a rotation of the selected object about the selected axis by an angle proportional to the length of the translation of the cursor along the selected axis; and an affinity of the selected object along the selected axis by a distance proportional to the length of the translation of the cursor along the selected axis.

The coordinate system may be a Cartesian coordinate system having an orientation depending on a viewpoint of the scene. Alternatively, the coordinate system may be a Cartesian coordinate system having an orientation determined by a manipulation tool displayed in the three-dimensional scene.

Step c) may further comprise changing the shape of the cursor so that it only represents the selected axis.

The selected object may be a node of a mesh.

Another object of the invention is a computer program product, stored on a non-transitory computer-readable data-storage medium, comprising computer-executable instructions to cause a computer system to carry out such a method.

A further object of the invention is a non-transitory computer-readable data-storage medium containing computer-executable instructions to cause a computer system to carry out such a method.

Yet another object of the invention is a computer system comprising a processor coupled to a memory and a graphical user interface, the memory storing computer-executable instructions to cause the computer system to carry out such a method.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

Additional features and advantages of the present invention will become apparent from the subsequent description, taken in conjunction with the accompanying drawings, which show.

DETAILED DESCRIPTION

A description of example embodiments follows.

Hereafter, a "three-dimensional" (or "3D") modeled object will be an object, or rather its digital representation in a computer system, allowing a three-dimensional (3D) graphical representation. A 3D representation allows the viewing of the part from all angles (viewpoints). For example, a 3D modelled object, when 3D represented, may be handled and turned around any of its axes, or around any axis in the screen on which the representation is displayed. A three-dimensional scene is constituted by a plurality of 3D modeled objects disposed in a three-dimensional space.

An idea at the basis of the invention is to use the cursor itself, whose shape is suitably modified, as an interactor. This eliminates the time-consuming operations of associating the interactor to an object and then clicking on an element of the interactor to select a transformation. Moreover, there is no visual obstruction beside the small one caused by the cursor, which has to be present in any case.

Figure 1:
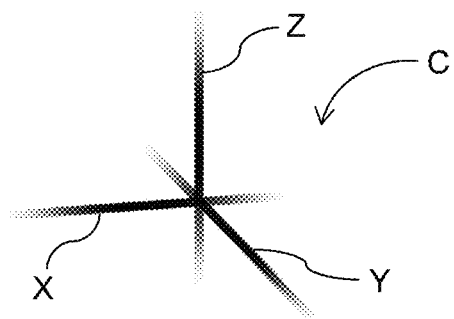
FIG. 1, a possible shape of a cursor used in the inventive method.

FIG. 1 shows a possible cursor/interactor C according to an embodiment of the invention, having a shape which symbolically represents three non-planar axes X, Y and Z. Advantageously, these axes are mutually perpendicular and form a Cartesian coordinate system. They may correspond to an "intrinsic" coordinate system of the scene, whose orientation varies with the viewpoint, or it may be freely oriented with respect to it, as it will be discussed later. The transformation of a "normal" cursor into a cursor/interactor according to the invention may be triggered e.g. by a command inputted using a keyboard or by selecting an item from a menu.

Figure 2A:
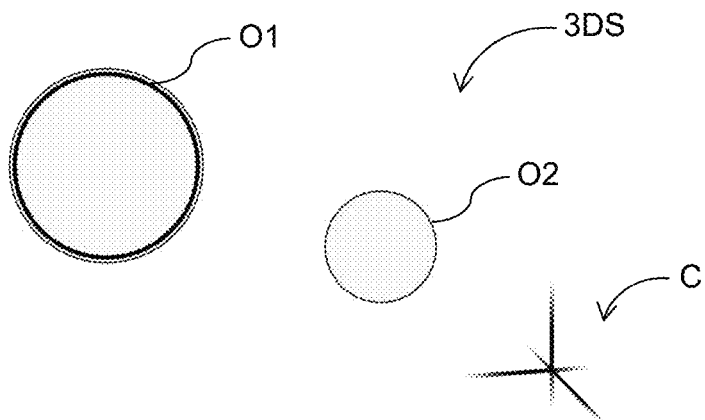
FIG. 2A and 2B, respectively, the "explicit" and the "implicit" selection of an object to be manipulated according to different embodiments of the invention.
Figure 2B:
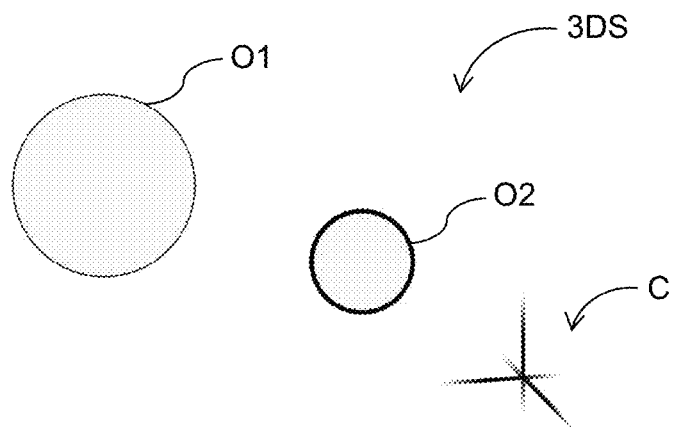

The cursor C is placed on the scene and moved using a suitable pointing device, e.g. a mouse. As it is customary for a cursor, it may be used to select an object of the scene. The selection may be either explicit or implicit. Explicit selection is performed e.g. by hovering the cursor over an object of the scene and clicking on it e.g. using a mouse button. Usually, the selected object is highlighted, and it remains selected even when the cursor moves away, until it is de-selected e.g. by clicking again while the cursor is not over it. On FIG. 2A, for instance, object O1 of the scene 3DS is selected and remains so even if the cursor C is no longer hovering over it. According to a preferred embodiment of the invention, however, the selection may also be implicit. This means that, when no object of the scene has been explicitly selected, the focus is on the object nearest to the cursor. For instance if, starting from the situation of FIG. 2A, object O1 is de-selected, then object O2 is implicitly selected (see FIG. 2B). Implicit selection is somehow ephemeral, as it is lost as soon as the cursor moves near to another object.

Figure 3A:
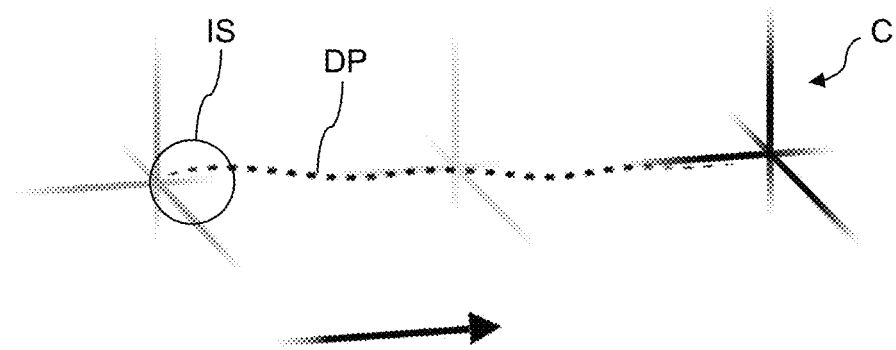
FIG. 3A and 3B, a drag operation according to an embodiment of the invention.
Figure 3B:
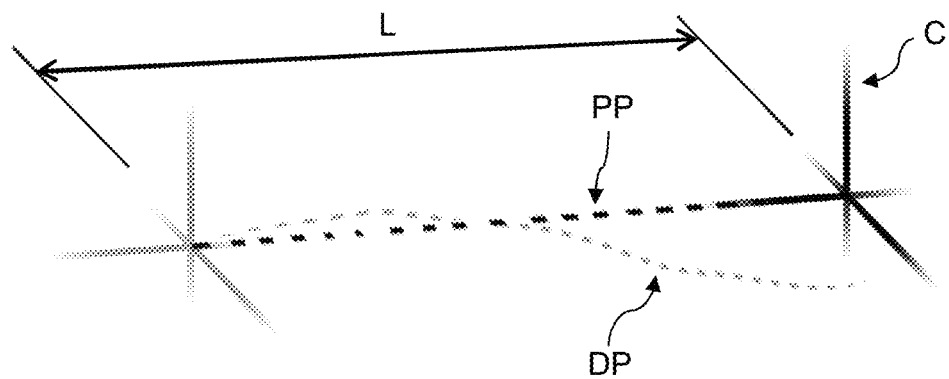

The explicitly or implicitly selected object may be manipulated by simply performing a "drag" with the cursor. A "drag" consists in a translation of the cursor performed while a different specific action is performed using an input device; typically this action is the pressing of a button of a mouse, touchpad or joystick used to control the cursor. FIG. 3A illustrates the translation of the cursor C during a drag operation. In general, the path DP defined by the drag operation (corresponding e.g. to the trajectory of a mouse moving on a mouse pad) is not perfectly rectilinear; however, an initial segment IS of the path, extending e.g. on a few millimeters, for instance 5 mm, may be considered to be approximately straight. According to an embodiment of the invention, the initial segment of the path is used to identify the initial direction of the movement of the cursor. Then, the axis of the coordinate system represented by the cursor whose direction is closest to said initial direction of the movement is selected. In the example of FIG. 3A, the initial segment IS of the path is mostly oriented along the X axis of the cursor; therefore this axis is selected and constitutes the axis of the transformation. Advantageously, the cursor displayed on the screen does not follows the path DP defined by the drag, but its projection of the selected axis, PP, as illustrated on FIG. 3B. This is not essential, but it helps the user to understand which axis has been selected. Optionally, the shape of the cursor may also change to clearly identify the selected axis (see below, FIG. 5B).

The transformation is defined by the selected axis and by a numerical value which corresponds to the length L of path PP, i.e. of the displacement of the cursor in the direction of the selected axis. The type of transformation is predetermined, and cannot be chosen by the user. This is to say that the inventive cursor/interactor only allows performing a single and predetermined kind of manipulations, e.g. a translation along the selected axis, or an affinity (rescaling) in the direction of said axis, or a rotation about it. Therefore, it is less flexible than e.g. the "robot" of document EP0824247, which allows performing several different kinds of manipulations. However, in some applications a single kind of manipulation is meaningful, in which case the inventive GUI is perfectly appropriate. In several other applications, one kind of manipulations (often the translation) will be by far the most frequently used; in these cases it will be possible to use the inventive GUI by default and to switch to a "universal" one (e.g. a "robot") when required. The switching may be performed e.g. by performing a right-button click using a mouse to make a menu appear, and then by choosing an appropriate item of said menu.

When it can be used, the inventive GUI allows manipulating objects much faster and more easily than according to the prior art. Particularly when implicit selection is used, it is not necessary to click onto the object to be manipulated, but it is sufficient to position the cursor near it. Moreover, it is not necessary to click onto an interactor to select the manipulation axis. A simple "gesture" (a drag operation) is sufficient.

Also, there is minimal visual obstruction as only the cursor is superimposed to the scene, and its position is not critical.

Figure 4:
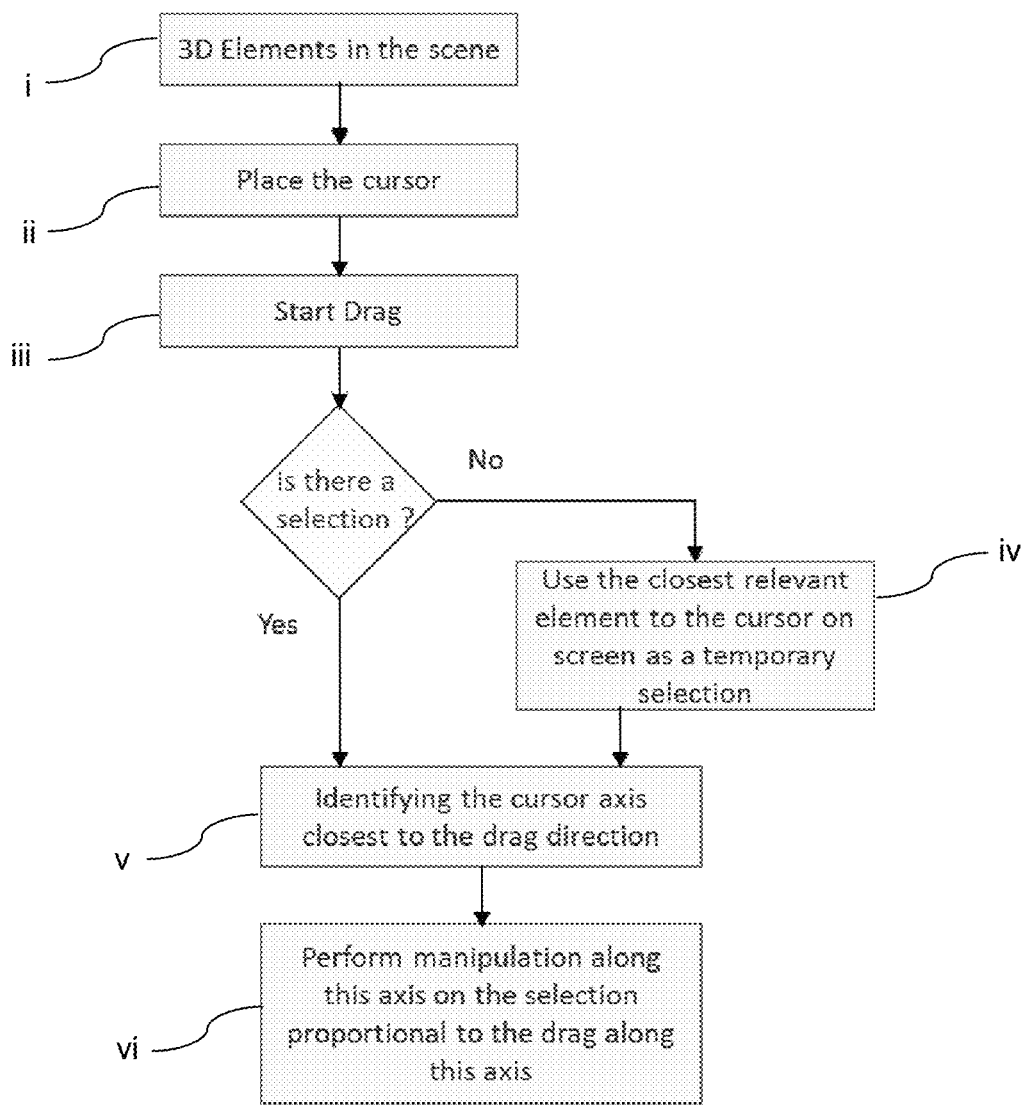
FIG. 4, a flow-chart of a method according to an embodiment of the invention.

FIG. 4 is a flow-chart of the inventive method. First of all (i), a 3D scene comprising objects which can be manipulated is displayed on a screen. Then, a modified cursor C, such as the one of FIG. 1, is superimposed on said scene (ii). When the user starts a drag operation (iii), the computer systems searches a selected object of the scene. The object may be explicitly selected using the cursor in a conventional way; otherwise, the object which is closest to the cursor is considered to be implicitly selected (iv). The initial drag direction is then detected, and the axis of the cursor nearest to this direction (i.e. forming the smallest angle with it) is identified (v). Then the manipulation is performed along the identified axis, and with a magnitude proportional to the length of the cursor translation along said axis (vi).

A particular application of the inventive method consists in moving the nodes of a mesh, in order e.g. to freely define the shape of a surface. As the nodes are points, only their translational degrees of freedom are meaningful, therefore the inventive GUI can perform all the possible manipulations on them.

Figure 5A:
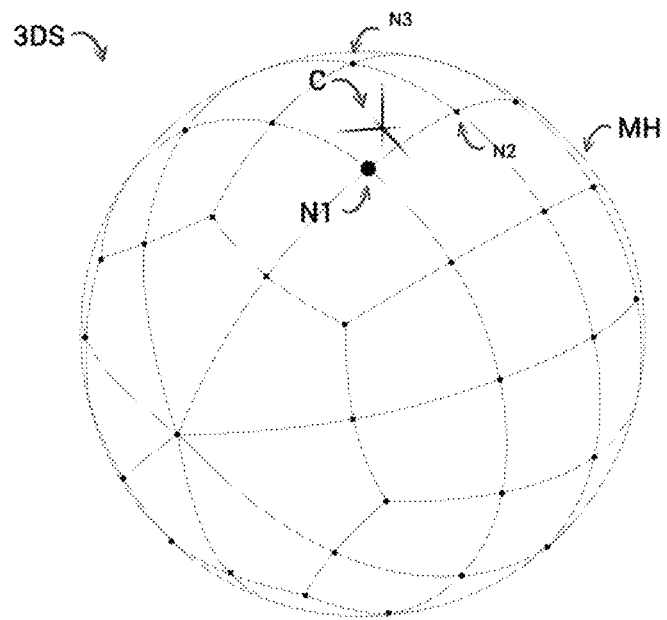
FIGS. 5A and 5B, the application of an embodiment of the invention, implementing "implicit" object selection, to the deformation of a three-dimensional grid.
Figure 5B:
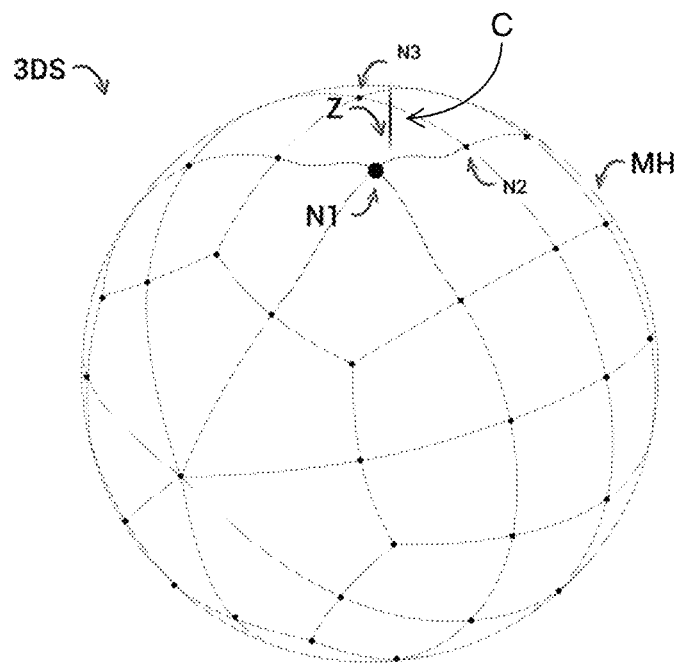

FIG. 5A shows a mesh MH comprising a plurality of nodes N1, N2, N3 . . . connected by edges. Node N1, which is implicitly selected, is highlighted. A drag operation is performed, with an initial direction essentially along the "Z" axis of the cursor. This initial direction is detected, and as a consequence:

The cursor moves exclusively along said direction; and
The selected node N1 is displaced, by an amount proportional to the cursor translation length, along this same direction, which in turn deforms the mesh (FIG. 5B).

In the embodiment of FIGS. 5A and 5B, the shape of the cursor changes, during the drag operation, in order to inform the user of the axis that has been selected. More particularly, as visible on FIG. 5B, during the drag operation the cursor only displays the selected axis, Z.

Figure 6:
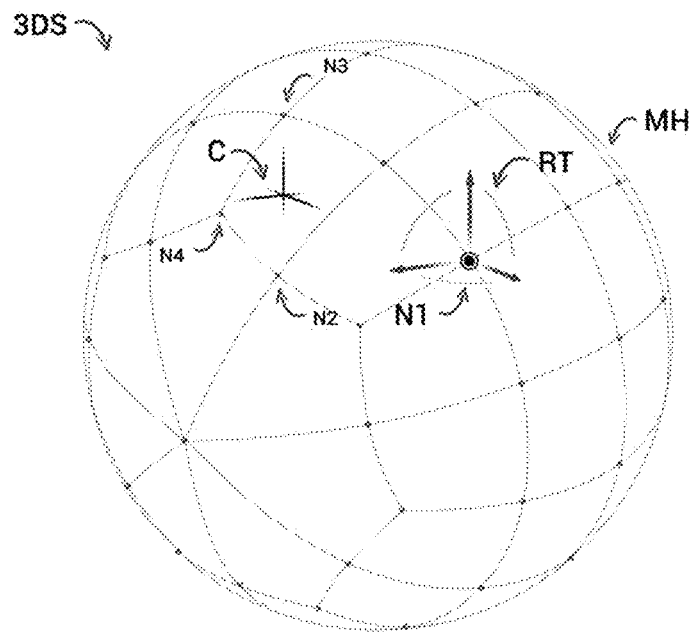
FIG. 6, the application of a different embodiment of the invention, implementing "explicit" object selection, to the deformation of a three-dimensional grid.

Until now, it has been assumed that the orientation of the axes of the cursor is fixed. It is not necessarily so. For instance, FIG. 6 illustrates an embodiment wherein the user has the possibility of making a "robot" interactor RT appear, and of associating it to an explicitly-selected node N1 of a mesh. The axes of the cursor C are linked to those of the "robot", and therefore can be freely oriented with respect to the scene. As node N1 is explicitly selected, the remaining nodes (N2, N3, N4 . . . ) are unaffected by the position of the cursor.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 7:
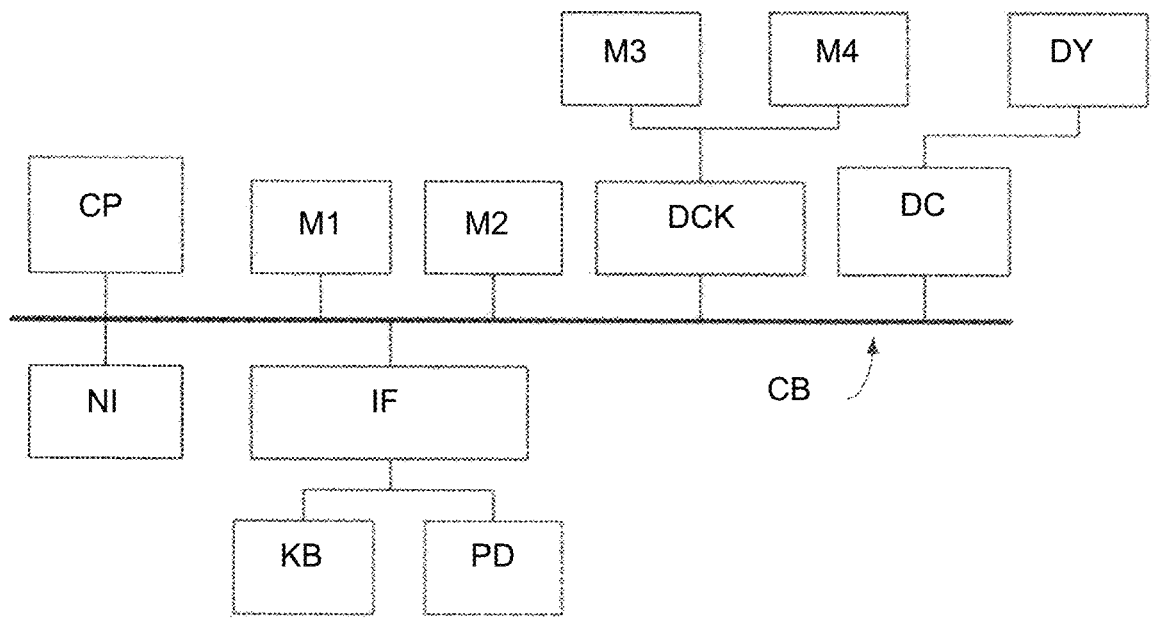
FIGS. 7 and 8, block diagrams of respective computer systems suitable for carrying out a method according to different embodiments of the invention.

A computer—more particularly a Computer Aided Design system or station—suitable for carrying out a method according to an exemplary embodiment of the present invention is described with reference to FIG. 7. In FIG. 7, the computer includes a Central Processing Unit CPU which performs the processes described above. The process can be stored as an executable program, i.e. a set of computer-readable instructions in memory, such as RAM M1 or ROM M2, or on hard disk drive (HDD) M3, DVD/CD drive M4, or can be stored remotely. Moreover, one or more computer files defining the three-dimensional scene comprising a plurality of objects may also be stored on one or more of memory devices M1 to M4, or remotely.

The claimed invention is not limited by the form of the computer-readable media on which the computer-readable instructions and/or the digital files of the inventive process are stored. For example, the instructions and files can be stored on CDs, DVDs, in FLASH memory, RAM, ROM, PROM, EPROM, EEPROM, hard disk or any other information processing device with which the Computer Aided Design or illustration authoring station communicates, such as a server or computer. The program and the files can be stored on a same memory device or on different memory devices.

Further, a computer program suitable for carrying out the inventive method can be provided as a utility application, background daemon, or component of an operating system, or combination thereof, executing in conjunction with CPU 800 and an operating system such as Microsoft VISTA, Microsoft Windows 8 or 10, UNIX, Solaris, LINUX, Apple MAC-OS and other systems known to those skilled in the art.

The Central Processing Unit CPU can be a Xenon processor from Intel of America or an Opteron processor from AMD of America, or can be other processor types, such as a Freescale ColdFire, IMX, or ARM processor from Freescale Corporation of America. Alternatively, the Central Processing Unit can be a processor such as a Skylake from Intel Corporation of America, or can be implemented on an FPGA, ASIC, PLD or using discrete logic circuits, as one of ordinary skill in the art would recognize. Further, the Central Processing Unit can be implemented as multiple processors cooperatively working to perform the computer-readable instructions of the inventive processes described above.

The Computer Aided Design station in FIG. 7 also includes a network interface NI, such as an Intel Ethernet PRO network interface card from Intel Corporation of America, for interfacing with a network, such as a local area network (LAN), wide area network (WAN), the Internet and the like. The Computer Aided Design station further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard and the pointing device, together with the display controller and the I/O interfaces, allow the user to provide input commands—e.g. to move the cursor—and by the Computer Aided Design station for displaying the three-dimensional scene.

Disk controller DKC connects HDD M3 and DVD/CD M4 with communication bus CBS, which can be an ISA, EISA, VESA, PCI, or similar, for interconnecting all of the components of the Computer Aided Design station.

A description of the general features and functionality of the display, keyboard, pointing device, as well as the display controller, disk controller, network interface and I/O interface is omitted herein for brevity as these features are known.

Figure 8:
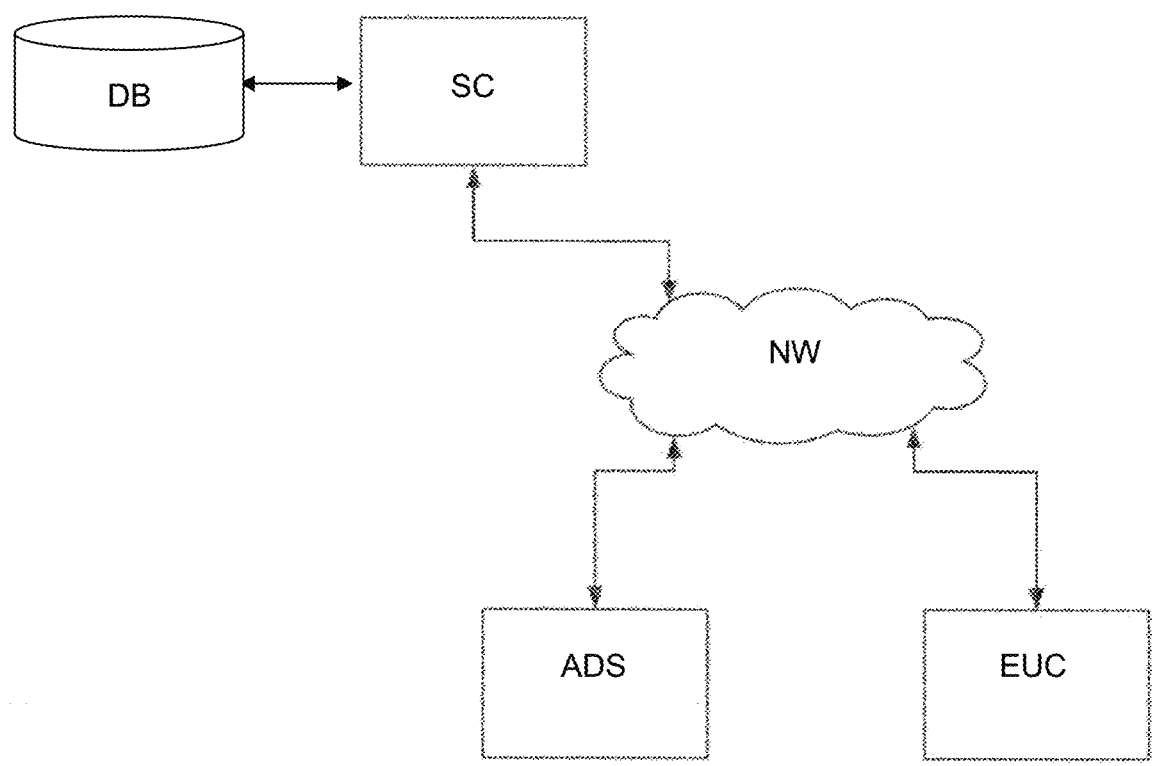

FIG. 8 is a block diagram of a computer system suitable for carrying out a method according to a different exemplary embodiment of the present invention.

In FIG. 8, the executable program EXP and the computer files defining the three-dimensional are stored on memory devices connected to a server SC. The memory devices and the overall architecture of the server may be the same as discussed above with reference to FIG. 7, except that display controller, display, keyboard and/or pointing device may be missing in the server.

The server SC is then connected to an administrator system ADS and end user computer EUC via a network NW.

The overall architectures of the administrator system and of the end user computer may be the same as discussed above with reference to FIG. 7, except that the memory devices of the administrator system and the end user computer do not store the executable program EXP and/or the computer files defining the three-dimensional scene. However, the end user computer does store a client program designed for cooperating with the executable program of the server, as it will be discussed below.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses, via the network NW, a database DB stored by the server SC and containing files defining three-dimensional scenes or elements thereof. This allows an end user to open and possibly modify such a file, e.g. by manipulating one or more objects of the scene. The server performs the processing as described above, and transmits to the end user computer an image file corresponding to the desired representation of the scene, again using the network NW.

Although only one administrator system ADS and one end user system EUX are shown, the system can support any number of administrator systems and/or end user systems without limitation. Similarly, multiple servers can also be implemented in the system without departing from the scope of the present invention Any processes described herein should be understood as representing modules, segments, or portions of code which include one or more executable instructions for implementing specific logical functions or steps in the process, and alternate implementations are included within the scope of the exemplary embodiment of the present invention.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:
1. A computer-implemented method for manipulating at least one three-dimensionally modeled object in a three-dimensional scene displayed on a computer display, the method comprising the steps of:
 a) displaying, in the three-dimensional scene, a cursor controlled by a pointing device, and transform it into a modified cursor having a shape representing three axes of a coordinate system by a command inputted using a keyboard or by selecting an item from a menu;
 b) selecting an object of the three-dimensional scene, the selected object being a node of a mesh, the mesh including a plurality of nodes;
 c) detecting a drag operation performed by a user using said pointing device, said drag operation comprising: (i) a translation of the modified cursor, and (ii) automatically selecting an axis of the coordinate system as a function of said translation of the modified cursor; and
 d) performing a manipulation of the selected node of the mesh, said manipulation depending on the selected axis and on a length of the translation of the modified cursor along the selected axis, the position of nodes of the mesh that are unselected remaining unaffected.
2. The computer-implemented method of claim 1 wherein step c) comprises automatically selecting the axis of the coordinate system having a direction which is closest to that of an initial segment of said translation of the modified cursor.

3. The computer-implemented method of claim 2 wherein, after said initial segment, the translation of the modified cursor is only performed along the selected axis.

4. The computer-implemented method of claim 1 wherein step b) comprises automatically selecting the node of the mesh of the three-dimensional scene which is closest to the modified cursor.

5. The computer-implemented method of claim 1 wherein step b) comprises selecting a node of a mesh of the three-dimensional scene according to a command from the user.

6. The computer-implemented method of claim 1 wherein the manipulation performed in step d) is chosen among a group comprising:
   a translation of the selected node of the mesh along the selected axis by a distance proportional to the length of the translation of the modified cursor along the selected axis;
   a rotation of the selected node of the mesh about the selected axis by an angle proportional to the length of the translation of the modified cursor along the selected axis; and
   an affinity of the selected node of the mesh along the selected axis by a distance proportional to the length of the translation of the modified cursor along the selected axis.

7. The computer-implemented method of claim 1 wherein the coordinate system is a Cartesian coordinate system having an orientation depending on a viewpoint of the scene.

8. The computer-implemented method of claim 1 wherein the coordinate system is a Cartesian coordinate system having an orientation determined by a manipulation tool displayed in the three-dimensional scene.

9. The computer-implemented method of claim 1 wherein step c) further comprises changing the shape of the modified cursor so that it only represents the selected axis.

10. A computer program product, comprising:
    a non-transitory computer-readable data-storage medium, storing computer-executable instructions;
    the computer-executable instructions including instructions which cause a computer system to:
    a) display, in a three-dimensional scene, a cursor controlled by a pointing device, and transform it into a modified cursor having a shape representing three axes of a coordinate system by a command inputted using a keyboard or by selecting an item from a menu;
    b) select an object of the three-dimensional scene, the selected object being a node of a mesh, the mesh including a plurality of nodes;
    c) detect a drag operation performed by a user using said pointing device, said drag operation comprising: (i) a translation of the modified cursor, and (ii) automatically selecting an axis of the coordinate system as a function of said translation of the modified cursor; and
    d) perform a manipulation of the selected node of the mesh, said manipulation depending on the selected axis and on a length of the translation of the modified cursor along the selected axis, the position of nodes of the mesh that are unselected remaining unaffected.

11. A non-transitory computer-readable data-storage medium comprising:
    a memory area containing computer-executable instructions to cause a computer system to:
    a) display, in a three-dimensional scene, a cursor controlled by a pointing device, and transform it into a modified cursor having a shape representing three axes of a coordinate system by a command inputted using a keyboard or by selecting an item from a menu;
    b) select an object of the three-dimensional scene, the selected object being a node of a mesh, the mesh including a plurality of nodes;
    c) detect a drag operation performed by a user using said pointing device, said drag operation comprising: (i) a translation of the modified cursor, and (ii) automatically selecting an axis of the coordinate system as a function of said translation of the modified cursor; and
    d) perform a manipulation of the selected node of the mesh, said manipulation depending on the selected axis and on a length of the translation of the modified cursor along the selected axis, the position of nodes of the mesh that are unselected remaining unaffected.

12. A computer system comprising:
    a processor coupled to a memory and a graphical user interface;
    the memory storing computer-executable instructions to cause the computer system to:
    a) display, in a three-dimensional scene, a cursor controlled by a pointing device, and transform it into a modified cursor having a shape representing three axes of a coordinate system by a command inputted using a keyboard or by selecting an item from a menu;
    b) select an object of the three-dimensional scene, the selected object being a node of a mesh, the mesh including a plurality of nodes;
    c) detect a drag operation performed by a user using said pointing device, said drag operation comprising: (i) a translation of the modified cursor, and (ii) automatically selecting an axis of the coordinate system as a function of said translation of the modified cursor; and
    d) perform a manipulation of the selected node of the mesh, said manipulation depending on the selected axis and on a length of the translation of the modified cursor along the selected axis, the position of nodes of the mesh that are unselected remaining unaffected.

* * * * *